(12) United States Patent
Hu et al.

(10) Patent No.: US 11,671,765 B2
(45) Date of Patent: Jun. 6, 2023

(54) MICRO-ELECTRO-MECHANICAL SYSTEM DEVICE

(71) Applicant: CSMC TECHNOLOGIES FAB2 CO., LTD., Wuxi (CN)

(72) Inventors: Yonggang Hu, Wuxi (CN); Guoping Zhou, Wuxi (CN); Changfeng Xia, Wuxi (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 170 days.

(21) Appl. No.: 17/422,300

(22) PCT Filed: Apr. 30, 2020

(86) PCT No.: PCT/CN2020/087979
§ 371 (c)(1),
(2) Date: Jul. 12, 2021

(87) PCT Pub. No.: WO2020/228543
PCT Pub. Date: Nov. 19, 2020

(65) Prior Publication Data
US 2022/0086571 A1 Mar. 17, 2022

(30) Foreign Application Priority Data
May 13, 2019 (CN) .......................... 201910392505.X

(51) Int. Cl.
*H04R 19/00* (2006.01)
*H04R 19/04* (2006.01)
*B81B 7/02* (2006.01)

(52) U.S. Cl.
CPC .............. *H04R 19/04* (2013.01); *B81B 7/02* (2013.01); *H04R 19/005* (2013.01);
(Continued)

(58) Field of Classification Search
CPC ................. H04R 19/04; H04R 19/005; H04R 2201/003; H04R 7/16; B81B 7/02;
(Continued)

(56) References Cited

U.S. PATENT DOCUMENTS

2014/0291786 A1* 10/2014 Zoellin ................. B81B 3/0051
257/416
2018/0262845 A1* 9/2018 Shi .......................... B81B 3/007
(Continued)

FOREIGN PATENT DOCUMENTS

CN 103402163 A 11/2013
CN 103702269 A 4/2014
(Continued)

OTHER PUBLICATIONS

PCT International Search Report (w/ English translation) for corresponding PCT Application No. PCT/CN2020/087979, dated Aug. 3, 2020, 6 pages.

*Primary Examiner* — Matthew A Eason
(74) *Attorney, Agent, or Firm* — Dority & Manning, PA

(57) ABSTRACT

A Micro-Electro-Mechanical System (MEMS) device includes a substrate, and a first sacrificial layer, a first conductive film, a second sacrificial layer, and a second conductive film successively laminated on the substrate, the second sacrificial layer being provided with a cavity; and further includes an amplitude-limiting layer provided with a first through hole and an isolation layer provided with a second through hole. The amplitude-limiting layer is located between the first conductive film and the first sacrificial layer and the isolation layer is located between the amplitude-limiting layer and the first conductive film, and/or the amplitude-limiting layer is located on the second conductive film and the isolation layer is located between the amplitude-limiting layer and the second conductive film. The ampli- (Continued)

tude-limiting layer extends to a projection region of an opening of the cavity and is in a suspended state.

15 Claims, 2 Drawing Sheets

(52) U.S. Cl.
CPC ......... *B81B 2201/0257* (2013.01); *B81B 2203/0127* (2013.01); *H04R 2201/003* (2013.01)

(58) Field of Classification Search
CPC .... B81B 2201/0257; B81B 2203/0127; B81B 3/0021; B81B 3/0051
See application file for complete search history.

(56) References Cited

U.S. PATENT DOCUMENTS

2018/0317033 A1* 11/2018 Zhang .................. B81B 3/007
2018/0362332 A1   12/2018 Khenkin et al.

FOREIGN PATENT DOCUMENTS

| CN | 104105041 A | 10/2014 |
| CN | 204031449 U | 12/2014 |
| CN | 206061135 U | 3/2017 |
| CN | 107404698 A | 11/2017 |

* cited by examiner

MICRO-ELECTRO-MECHANICAL SYSTEM DEVICE

CROSS-REFERENCE TO RELATED APPLICATION

This application is a US national phase entry of International Application No. PCT/CN2020/087979 filed Apr. 30, 2020, which, in turn, claims priority to and benefits of Chinese Patent Application No. 201910392505.X, filed with the Patent Office of P.R. China on May 13, 2019, and entitled "MICRO-ELECTRO-MECHANICAL SYSTEM DEVICE", the entire contents of both of which are incorporated herein by reference.

TECHNICAL FIELD

The present disclosure relates to the field of Micro-Electro-Mechanical System (MEMS), more particularly, to an MEMS device.

BACKGROUND

When an MEMS device uses deformation of a film to realize conversion of mechanical energy and electric energy, if a degree of deformation of the film is large, once the stress bearing capability of the film is exceeded, the film may break and lead to failure of the device. For example, an MEMS microphone has a diaphragm and a back plate, and a cavity is formed between the diaphragm and the back plate, the diaphragm and the back plate form a capacitor, and the back plate is designed with sound holes. An airflow enters the cavity through the sound holes, so that the diaphragm or the back plate deforms and the capacitance value changes, thereby realizing acousto-electric conversion. Since the diaphragm and the back plate are very thin, when the airflow is large, the diaphragm or the back plate may break when the degree of deformation thereof reaches a certain level, resulting in the failure of the MEMS microphone.

SUMMARY

Various embodiments of the present disclosure provide a first MEMS device, including:
a substrate;
a first sacrificial layer disposed on the substrate, the substrate being provided with a back cavity penetrating the substrate and the first sacrificial layer;
a first conductive film disposed on the first sacrificial layer and covering the back cavity;
a second sacrificial layer disposed on the first conductive film, the second sacrificial layer being provided with a cavity penetrating the second sacrificial layer;
a second conductive film disposed on the second sacrificial layer and covering the cavity; and
a first amplitude-limiting layer and a first isolation layer that are laminated, the first amplitude-limiting layer being provided with a first through hole, the first isolation layer being provided with a second through hole, and an orthographic projection of the first through hole being located in the second through hole and a diameter of the first through hole being smaller than that of the second through hole; an orthographic projection of the first amplitude-limiting layer partially overlapping with an opening region of the cavity, and the orthographic projection of the first through hole also partially overlapping with the opening region of the cavity; the first amplitude-limiting layer being located between the first conductive film and the first sacrificial layer, and the first isolation layer being located between the first amplitude-limiting layer and the first conductive film.

The embodiments of the present disclosure provide a second MEMS device, including:
a substrate;
a first sacrificial layer disposed on the substrate, the substrate being provided with a back cavity penetrating the substrate and the first sacrificial layer;
a first conductive film disposed on the first sacrificial layer and covering the back cavity;
a second sacrificial layer disposed on the first conductive film, the second sacrificial layer being provided with a cavity penetrating the second sacrificial layer;
a second conductive film disposed on the second sacrificial layer and covering the cavity;
a second amplitude-limiting layer and a second isolation layer that are laminated, the second amplitude-limiting layer being provided with a first through hole, the second isolation layer being provided with a second through hole, and an orthographic projection of the first through hole being located in the second through hole and a diameter of the first through hole being smaller than that of the second through hole; an orthographic projection of the second amplitude-limiting layer partially overlapping with an opening region of the cavity, and the orthographic projection of the first through hole also partially overlapping with the opening region of the cavity; the second amplitude-limiting layer being located on the second conductive film, and the second isolation layer being located between the second amplitude-limiting layer and the second conductive film.

The first amplitude-limiting layer is provided with a single first through hole, the orthographic projection of the first through hole is located in the opening region of the cavity, and an overlapping region between the orthographic projection of the first amplitude-limiting layer and the opening region of the cavity is in the shape of an equal-width ring.

The embodiments of the present disclosure provide a third MEMS device, including:
a substrate;
a first sacrificial layer disposed on the substrate, the substrate being provided with a back cavity penetrating the substrate and the first sacrificial layer;
a first conductive film disposed on the first sacrificial layer and covering the back cavity;
a second sacrificial layer disposed on the first conductive film, the second sacrificial layer being provided with a cavity penetrating the second sacrificial layer;
a second conductive film disposed on the second sacrificial layer and covering the cavity;
a first amplitude-limiting layer and a first isolation layer that are laminated, wherein the first amplitude-limiting layer is provided with a first through hole, the first isolation layer is provided with a second through hole, and an orthographic projection of the first through hole is located in the second through hole and a diameter of the first through hole is smaller than that of the second through hole; an orthographic projection of the first amplitude-limiting layer partially overlaps with an opening region of the cavity, and the orthographic projection of the first through hole also partially overlaps with the opening region of the cavity; the first amplitude-limiting layer is located between the first conductive film and the first sacrificial layer, and the first isolation layer is located between the first amplitude-limiting layer and the first conductive film; and a second amplitude-limiting layer and a second isolation layer that are laminated, wherein the second amplitude-limiting layer is provided with a first through hole, the second isolation layer is provided with a second through hole, and an orthographic projection of the first through hole is located in the second through hole and a diameter of the first through hole is smaller than that of the second through hole; an orthographic projection of the second amplitude-limiting layer partially overlaps with an opening region of the cavity, and the orthographic projection of the first through hole also partially overlaps with the opening region of the cavity; the second amplitude-limiting layer is located on the second conductive film, and the second isolation layer is located between the second amplitude-limiting layer and the second conductive film.

Details of one or more embodiments of the present disclosure are set forth in the following accompanying drawings and descriptions. Other features, objectives, and advantages of the present disclosure become obvious with reference to the specification, the accompanying drawings, and the claims.

BRIEF DESCRIPTION OF THE DRAWINGS

In order to better describe and illustrate embodiments and/or examples of those applications disclosed herein, reference may be made to one or more accompanying drawings. Additional details or examples used to describe the accompanying drawings should not be considered as limitations on the scope of any of the disclosed applications, the presently described embodiments and/or examples, and the presently understood best mode of these applications.

DETAILED DESCRIPTION OF THE EMBODIMENTS

To facilitate the understanding of the present disclosure, a more comprehensive description of the present disclosure is given below with reference to the accompanying drawings. Preferred embodiments of the present disclosure are given in the accompanying drawings. However, the present disclosure may be implemented in many different forms and is not limited to the embodiments described herein. On the contrary, these embodiments are provided to understand the disclosed content of the present disclosure more thoroughly and comprehensively.

Unless otherwise defined, all technical and scientific terms used herein have the same meaning as commonly understood by those of ordinary skill in the art to which the present disclosure belongs. The terms used in the specification of the present disclosure are intended only to describe particular embodiments and are not intended to limit the present disclosure. The term "and/or" used herein includes any and all combinations of one or more of the associated listed items.

In order to fully understand the present disclosure, detailed steps and structures will be provided in the description below to explain the technical solution in the present disclosure. Preferred embodiments of the present disclosure are described in detail below; however, in addition to these detailed descriptions, there may be other embodiments of the present disclosure.

Embodiment 1

Figure 1:
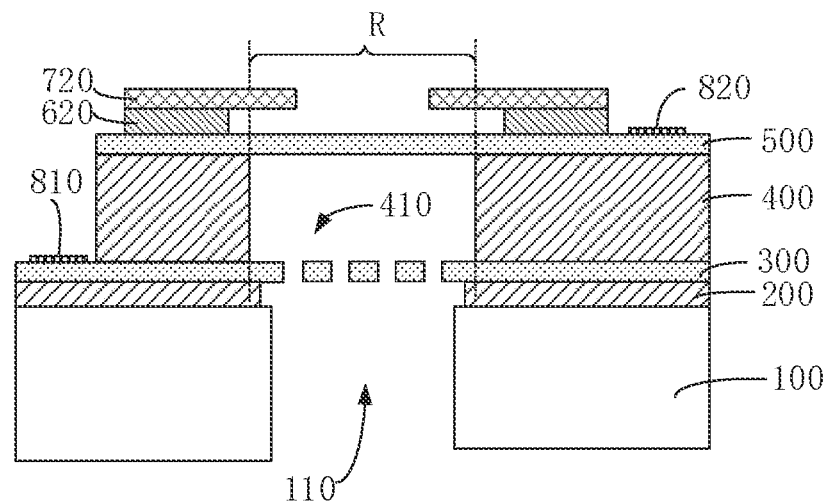
FIG. 1 is a cross-sectional view of an MEMS device according to an embodiment of the present disclosure.

As shown in FIG. 1, the MEMS device includes a substrate 100; a first sacrificial layer 200 disposed on the substrate 100, the substrate 100 being provided with a back cavity 110 penetrating the substrate 100 and the first sacrificial layer 200; a first conductive film 300 disposed on the first sacrificial layer 200, the first conductive film 300 covering the back cavity 110; a second sacrificial layer 400 disposed on the first conductive film 300, the second sacrificial layer 400 being provided with a cavity 410 penetrating the second sacrificial layer 400; and a second conductive film 500 disposed on the second sacrificial layer 400, the second conductive film 500 covering the cavity 410. The MEMS device further includes an amplitude-limiting layer and an isolation structure. The amplitude-limiting layer is located on the second conductive film and the isolation structure is located between the amplitude-limiting layer and the second conductive film. The amplitude-limiting layer located on the second conductive film 500 is defined as a second amplitude-limiting layer 720, and an isolation layer located between the second conductive film 500 and the second amplitude-limiting layer 720 is defined as a second isolation layer 620. Specifically, the second conductive film 500 is provided thereon with the second isolation layer 620. The second isolation layer 620 is provided with a second through hole. The second isolation layer 620 is provided thereon with the second amplitude-limiting layer 720. The second amplitude-limiting layer 720 is provided with a first through hole. An orthographic projection of the first through hole is located in an orthographic region of the second through hole and a diameter of the first through hole is smaller than that of the second through hole. The second amplitude-limiting layer 720 has a part beyond the second isolation layer 620, that is, the second amplitude-limiting layer 720 covers part of the second through hole. At the same time, the first through hole faces the cavity 410, and the orthographic projection of the first pass hole partially overlaps with an opening region of the cavity 410, and an orthographic projection of the second amplitude-limiting layer 720 also partially overlaps with an opening region of the cavity 410. An orthographic region of an opening of the cavity 410 is defined as a region R. The second amplitude-limiting layer 720 extends into the region R, that is, part of the second amplitude-limiting layer 720 extends directly above a top opening of the cavity 410 and is in a suspended state.

In this embodiment, the first conductive film 300 and the second conductive film 500 cover the bottom and the top of the cavity 410 respectively. After an airflow enters the cavity 410, the first conductive film 300 and the second conductive film 500 may deform, specifically, may protrude toward a side away from the cavity 410. The second isolation layer 620 is disposed on the second conductive film 500 and the second amplitude-limiting layer 720 is disposed on the second isolation layer 620. An orthographic projection of the first through hole is located in an orthographic region of the second through hole and a diameter of the first through hole is smaller than that of the second through hole. That is, the second amplitude-limiting layer 720 has a part beyond the second isolation layer 620 and covers part of the second through hole. An orthographic projection of the second amplitude-limiting layer 720 partially overlaps with an opening region of the cavity 410, that is, the part of the second amplitude-limiting layer 720 beyond the second isolation layer 620 extends into the region R facing the top opening of the cavity 410 and is in a suspended state, and the second amplitude-limiting layer 720 is not in contact with the second conductive film 500. Therefore, the setting of the second isolation layer 620 and the second amplitude-limiting layer 720 may not affect the stress of the second conductive film 500. When the second conductive film 500 deforms and protrudes to contact the second amplitude-limiting layer 720, the suspended part of the second amplitude-limiting layer 720 extending into the region R may prevent further deformation of the second conductive film 500, so as to avoid the breakage of the second conductive film 500 due to excessive deformation.

In the above embodiment, the diameter of the second through hole may be greater than or equal to an opening width of the cavity, that is, an orthographic projection of the second isolation layer 620 is located in a coverage region of the second sacrificial layer 400, so that the second isolation layer 620 can be entirely supported on the second sacrificial layer 400, which is conducive to stress matching between the film layers.

Embodiment 2

Figure 2:
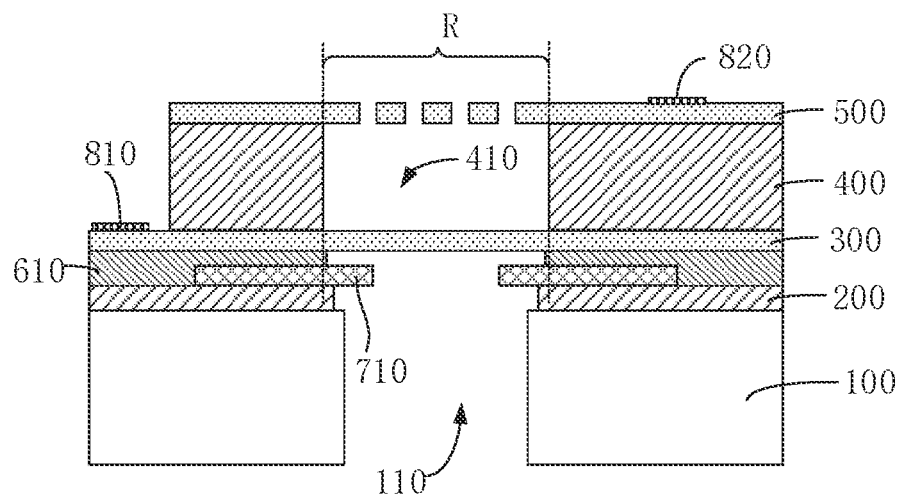
FIG. 2 is a cross-sectional view of an MEMS device according to another embodiment of the present disclosure.

Embodiment 2 differs from Embodiment 1 in positions of the amplitude-limiting layer and the isolation layer. As shown in FIG. 2, in this embodiment, the amplitude-limiting layer is located between the first conductive film 300 and the first sacrificial layer 200 and the isolation layer is located between the amplitude-limiting layer and the first conductive film 300. To distinguish different positions of the amplitude-limiting layer and the isolation layer in Embodiment 2 and Embodiment 1, the amplitude-limiting layer located between the first conductive film 300 and the first sacrificial layer 200 is defined as a first amplitude-limiting layer 710, and the isolation layer located between the amplitude-limiting layer and the first conductive film 300 is defined as a first isolation layer 610. A specific structure of the MEMS device in this embodiment is as follows: a first sacrificial layer 200 is disposed on the substrate 100, the substrate 100 being provided with a back cavity 110 penetrating the substrate 100 and the first sacrificial layer 200; a first amplitude-limiting layer 710 is disposed on the first sacrificial layer 200, the first sacrificial layer 200 being provided with a first through hole, and the first through hole being communicated with the back cavity 110; a first isolation layer 610 is disposed on the first amplitude-limiting layer 710, the first isolation layer 610 being provided with a second through hole also communicated with the back cavity 110; a first conductive film 300 is disposed on the first isolation layer 610, the first conductive film 300 covering the back cavity 110; a second sacrificial layer 400 is disposed on the first conductive film 300, the second sacrificial layer 400 being provided with a cavity 410 penetrating the second sacrificial layer 400; and a second conductive film 500 is disposed on the second sacrificial layer 400, the second conductive film 500 covering the cavity 410. An orthographic projection of the first through hole is located in the second through hole, and a diameter of the first through hole is smaller than that of the second through hole. At the same time, the first through hole provided on the first amplitude-limiting layer 710 faces the cavity 410, an orthographic projection of the first amplitude-limiting layer 710 partially overlaps with an opening region of the cavity 410. That is, the first amplitude-limiting layer 710 extends into an orthographic region R of an opening of the cavity 410, namely the first amplitude-limiting layer 710 extends directly below a bottom opening of the cavity 410 and is in a suspended state.

In this embodiment, one side of the first conductive film 300 away from the cavity 410 is provided with a first isolation layer 610 and a first amplitude-limiting layer 710. The first amplitude-limiting layer 710 is provided with a first through hole, the first isolation layer 610 is provided with a second through hole, an orthographic projection of the first through hole is located in the second through hole and a diameter of the first through hole is smaller than that of the second through hole, so that the first amplitude-limiting layer 710 has a part beyond the first isolation layer 610. The part of the first amplitude-limiting layer 710 beyond the first isolation layer 610 extends into the region R and is in a suspended state, which is not in contact with the first conductive film 300. Therefore, the setting of the first isolation layer 610 and the first amplitude-limiting layer 710 may not affect the stress of the first conductive film 300. When the first conductive film 300 deforms and protrudes to contact the first amplitude-limiting layer 710, the suspended part of the first amplitude-limiting layer 710 extending into the region R may prevent further deformation of the first conductive film 300, so as to avoid the breakage of the first conductive film 300 due to excessive deformation.

In the above embodiment, the diameter of the second through hole provided on the first isolation layer 610 is less than or equal to an opening width of the cavity 410, so that the second sacrificial layer 400 can be entirely supported on the first isolation layer 610, which is conducive to stress matching between the film layers.

Embodiment 3

Figure 3:
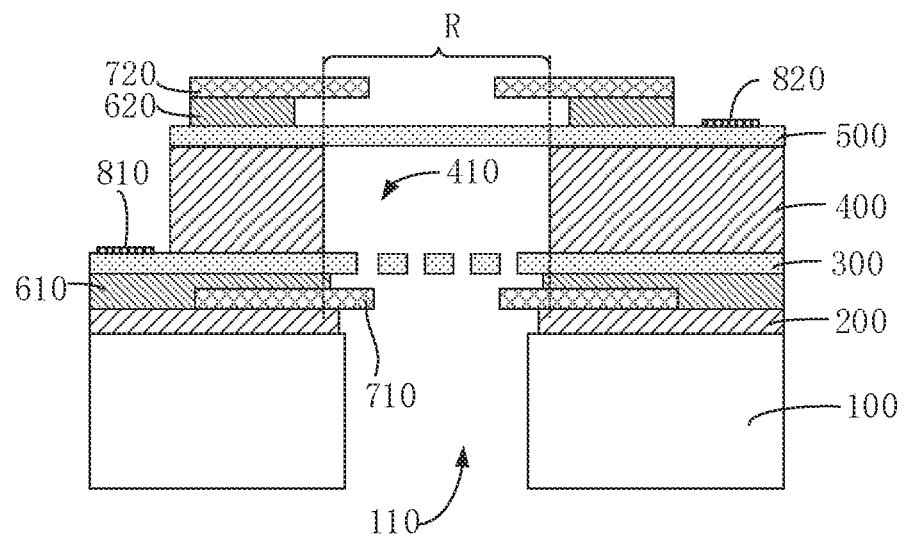
FIG. 3 is a cross-sectional view of an MEMS device according to yet another embodiment of the present disclosure.

Embodiment 3 differs from Embodiment 1 in that, the MEMS device includes an amplitude-limiting layer located on the second conductive film, wherein an isolation layer is disposed between the amplitude-limiting layer and the second conductive film, and also includes an amplitude-limiting layer located between the first conductive film and the first sacrificial layer, wherein an isolation layer is disposed between the amplitude-limiting layer and the second conductive film. That is, the MEMS device includes a second amplitude-limiting layer and a second isolation layer as well as a first amplitude-limiting layer and a first isolation layer. As shown in FIG. 3, in this embodiment, a specific structure of the MEMS device is as follows: a first sacrificial layer 200 is disposed on the substrate 100, the substrate 100 being provided with a back cavity 110 penetrating the substrate 100 and the first sacrificial layer 200; a first amplitude-limiting layer 710 is disposed on the first sacrificial layer 200, the first amplitude-limiting layer 710 being provided with a first through hole, and the first through hole being communicated with the back cavity 110; a first isolation layer 610 is disposed on the first amplitude-limiting layer 710, the first isolation layer 610 being provided with a second through hole also communicated with the back cavity 110; a first conductive film 300 is disposed on the first isolation layer 610, the first conductive film 300 covering the back cavity 110; a second sacrificial layer 400 is disposed on the first conductive film 300, the second sacrificial layer 400 being provided with a cavity 410 penetrating the second sacrificial layer 400; a second conductive film 500 is disposed on the second sacrificial layer 400, the second conductive film 500 covering the cavity 410; a second isolation layer 620 is disposed on the second conductive film 500, the second isolation layer 620 being provided with a second through hole; and a second amplitude-limiting layer 720 is disposed on the second isolation layer 620, the second amplitude-limiting layer 720 being provided with a first through hole. In the above structure, an orthographic projection of the first through hole provided on the first amplitude-limiting layer 710 is located in the second through hole of the first isolation layer 610, a diameter of the first through hole is smaller than that of the second through hole, and an orthographic projection of the first amplitude-limiting layer 710 partially overlaps with an opening region of the cavity 410, that is, the first amplitude-limiting layer 710 extends directly below a bottom opening of the cavity 410 and is in a suspended state; an orthographic projection of the first through hole provided on the second amplitude-limiting layer 720 is located in the second through hole of the second isolation layer 620, a diameter of the first through hole is smaller than that of the second through hole, and an orthographic projection of the second amplitude-limiting layer 720 partially overlaps with the opening region of the cavity 410, that is, the second amplitude-limiting layer 720 extends directly above the bottom opening of the cavity 410 and is in a suspended state.

In this embodiment, part of the first amplitude-limiting layer 710 extends into the region R and in a suspended state, which is not in contact with the first conductive film 300; and part of the second amplitude-limiting layer 720 extends into the region R and in a suspended state, which is not in contact with the second conductive film 500. Therefore, the setting of the first isolation layer 610 and the first amplitude-limiting layer 710 as well as the second isolation layer 620 and the second amplitude-limiting layer 720 may not affect the stress of the first conductive film 300 and the second conductive film 500. When the first conductive film 300 deforms and protrudes to contact the first amplitude-limiting layer 710, the suspended part of the first amplitude-limiting layer 710 extending into the region R may prevent further deformation of the first conductive film 300, so as to avoid the breakage of the first conductive film 300 due to excessive deformation. When the second conductive film 500 deforms and protrudes to contact the second amplitude-limiting layer 720, the suspended part of the second amplitude-limiting layer 720 extending into the region R may prevent further deformation of the second conductive film 500, so as to avoid the breakage of the second conductive film 500 due to excessive deformation. Therefore, in this embodiment, the first conductive film 300 and the second conductive film 500 may be protected at the same time.

Figure 4A:
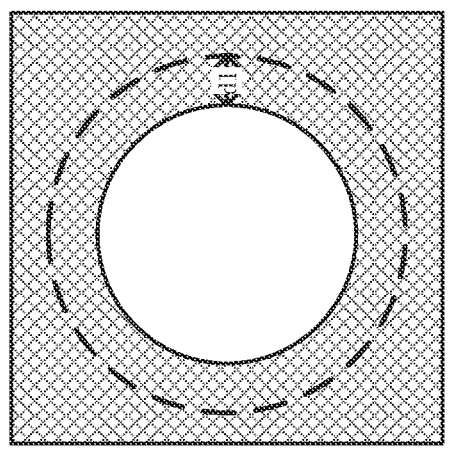
FIG. 4a is a top view of an amplitude-limiting layer according to an embodiment of the present disclosure.
Figure 4B:
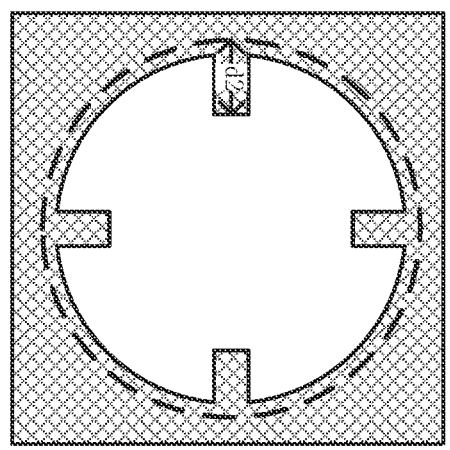
FIG. 4b is a top view of an amplitude-limiting layer according to another embodiment of the present disclosure.

In the above embodiments, the amplitude-limiting layer may be designed into a variety of shapes. In one embodiment, as shown in FIG. 4a, the amplitude-limiting layer is provided with a single first through hole, the orthographic projection of the first through hole is located in the opening region of the cavity (a region defined by the dashed box in FIG. 4a), an overlapping region between the orthographic projection of the amplitude-limiting layer and the opening region of the cavity is in the shape of a ring, and the ring is an equal-width ring with a width of d1. In this embodiment, only one large through hole is designed in the amplitude-limiting layer, so the preparation process is relatively easier to realize, and the large through hole has good influence on the airflow, and thus has little influence on frequency characteristics of the device. At the same time, the part of the amplitude-limiting layer extending to the opening region of the cavity is in the shape of an equal-width ring. That is, the amplitude-limiting layer has a uniform amplitude-limiting effect on all conductive films, and the amplitude-limiting effect is good. In another embodiment, as shown in FIG. 4b, the amplitude-limiting layer is provided with a single first through hole, a side wall of the amplitude-limiting layer defining the first through hole is provided with a protruding arm protruding toward the center of the first through hole, and an orthographic projection of the protruding arm extends to the opening region of the cavity (a region defined by dashed lines in FIG. 4b). In this embodiment, a protruding arm is provided, the protruding arm extends to the opening region of the cavity, the protruding arm is used to limit the amplitude, so that an area of the amplitude-limiting layer extending into the opening region of the cavity can be reduced, which further increases the diameter of the first through hole, further reduces the influence of the amplitude-limiting layer on the airflow, and reduces the influence of the amplitude-limiting layer on frequency characteristics of the device. In a specific embodiment, the amplitude-limiting layer is provided with a plurality of protruding arms, adjacent protruding arms are at equal spacing, and the protruding arms extend to an equal length within the opening region of the cavity, the width being d2. In this embodiment, the protruding arms have the same length and are uniformly disposed, so that the amplitude-limiting effect of the amplitude-limiting layer on the conductive films is more uniform. Four or more protruding arms may be provided. It may be understood that the more the number of the protruding arms, the more uniform the amplitude-limiting effect of the amplitude-limiting layer on the conductive films, and the better the amplitude-limiting effect.

The MEMS devices in the above embodiments may be an MEMS microphone. One of the first conductive film 300 and the second conductive film 500 is a back plate and the other is a diaphragm, and the back plate is provided with sound holes. Referring to FIG. 1, the first conductive film 300 is a back plate, the second conductive film 500 is a diaphragm, and the first conductive film 300 is provided with sound holes. Referring to FIG. 2, the first conductive film 300 is a diaphragm, the second conductive film 500 is a back plate, and the second conductive film 500 is provided with sound holes.

The MEMS devices in the above embodiments may further include a first electrode 810 and a second electrode 820. The first electrode 810 is connected to the first conductive film 300 and is led out, and the second electrode 820 is connected to the second conductive film 500 and is led out. With the first electrode 810 and the second electrode 820, the above structure can be connected to an external circuit to realize the transmission of sensing signals.

In the above embodiments, materials of the substrate, the first sacrificial layer, the first conductive film, the second conductive film, the isolation layer, and the amplitude-limiting layer have a variety of options. The materials of the first sacrificial layer, the second sacrificial layer, and each support layer are the same, which facilitates the etching of the film layers in one step in the manufacturing process. Specifically, the substrate is a semiconductor substrate, which may specifically be a silicon substrate. The first sacrificial layer, the second sacrificial layer, and the support layer are insulating layers, which may specifically be silicon oxide layers or polyimide layers. The first conductive film and the second conductive film have electrical conductivity, which may specifically be semiconductor conductive films or metal films. When they are semiconductor conductive films, they may specifically be doped polycrystalline silicon films. Since the amplitude-limiting layer is isolated from the conductive film through an isolation layer, there is no requirement for the insulation of the amplitude-limiting layer. The amplitude-limiting layer may be any one of a silicon nitride layer, a polycrystalline silicon layer, and a monocrystalline silicon layer, or a laminated composite film layer of more of the three layers.

The technical features in the above embodiments may be randomly combined. For concise description, not all possible combinations of the technical features in the above embodiments are described. However, all the combinations of the technical features are to be considered as falling within the scope described in this specification provided that they do not conflict with each other.

The above embodiments only describe several implementations of the present disclosure, which are described specifically and in detail, and therefore cannot be construed as a limitation on the patent scope of the present disclosure. It should be pointed out that those of ordinary skill in the art may make various changes and improvements without departing from the ideas of the present disclosure, which shall all fall within the protection scope of the present disclosure. Therefore, the patent protection scope of the present disclosure shall be subject to the appended claims.

The invention claimed is:

1. A Micro-Electro-Mechanical System (MEMS) device, comprising:
a substrate;
a first sacrificial layer disposed on the substrate, the substrate being provided with a back cavity penetrating the substrate and the first sacrificial layer;
a first conductive film disposed on the first sacrificial layer and covering the back cavity;
a second sacrificial layer disposed on the first conductive film, the second sacrificial layer being provided with a cavity penetrating the second sacrificial layer;
a second conductive film disposed on the second sacrificial layer and covering the cavity; and
a first amplitude-limiting layer and a first isolation layer that are laminated, the first amplitude-limiting layer being provided with a first through hole, the first isolation layer being provided with a second through hole, and an orthographic projection of the first through hole being located in the second through hole and a diameter of the first through hole being smaller than that of the second through hole; an orthographic projection of the first amplitude-limiting layer partially overlapping with an opening region of the cavity, and the orthographic projection of the first through hole also partially overlapping with the opening region of the cavity; the first amplitude-limiting layer being located between the first conductive film and the first sacrificial layer, and the first isolation layer being located between the first amplitude-limiting layer and the first conductive film.

2. The MEMS device according to claim 1, wherein the first amplitude-limiting layer is provided with a single first through hole, the orthographic projection of the first through hole is located in the opening region of the cavity, and an overlapping region between the orthographic projection of the first amplitude-limiting layer and the opening region of the cavity is in the shape of an equal-width ring.

3. The MEMS device according to claim 1, wherein the first amplitude-limiting layer is provided with a single first through hole, a side wall of the first amplitude-limiting layer defining the first through hole is provided with a protruding arm protruding toward the center of the first through hole, and an orthographic projection of the protruding arm extends to the opening region of the cavity.

4. The MEMS device according to claim 3, wherein the first amplitude-limiting layer is provided with a plurality of protruding arms, adjacent protruding arms are at equal spacing, and orthographic projections of the protruding arms extend to an equal length within the opening region of the cavity.

5. The MEMS device according to claim 3, wherein the diameter of the second through hole provided on the first isolation layer is less than or equal to an opening width of the cavity, and the second sacrificial layer is entirely supported on the first isolation layer.

6. The MEMS device according to claim 1, wherein the MEMS device is an MEMS microphone, one of the first conductive film and the second conductive film is a back plate and the other is a diaphragm, and the back plate is provided with sound holes.

7. The MEMS device according to claim 1, wherein the first amplitude-limiting layer is any one of a silicon nitride layer, a polycrystalline silicon layer, and a monocrystalline silicon layer or a laminated composite film layer of more of the three layers.

8. The MEMS device according to claim 7, wherein the substrate is a silicon substrate, and the first sacrificial layer, the second sacrificial layer, and a support layer are silicon oxide layers or polyimide layers.

9. A Micro-Electro-Mechanical System (MEMS) device, comprising:
a substrate;
a first sacrificial layer disposed on the substrate, the substrate being provided with a back cavity penetrating the substrate and the first sacrificial layer;
a first conductive film disposed on the first sacrificial layer and covering the back cavity;
a second sacrificial layer disposed on the first conductive film, the second sacrificial layer being provided with a cavity penetrating the second sacrificial layer;
a second conductive film disposed on the second sacrificial layer and covering the cavity; and
a second amplitude-limiting layer and a second isolation layer that are laminated, the second amplitude-limiting layer being provided with a first through hole, the second isolation layer being provided with a second through hole, and an orthographic projection of the first through hole being located in the second through hole and a diameter of the first through hole being smaller than that of the second through hole; an orthographic projection of the second amplitude-limiting layer partially overlapping with an opening region of the cavity, and the orthographic projection of the first through hole also partially overlapping with the opening region of the cavity; the second amplitude-limiting layer being located on the second conductive film, and the second isolation layer being located between the second amplitude-limiting layer and the second conductive film.

10. The MEMS device according to claim 9, wherein the second amplitude-limiting layer is provided with a single first through hole, the orthographic projection of the first through hole is located in the opening region of the cavity, and an overlapping region between the orthographic projection of the second amplitude-limiting layer and the opening region of the cavity is in the shape of an equal-width ring.

11. The MEMS device according to claim 9, wherein the second amplitude-limiting layer is provided with a single first through hole, a side wall of the second amplitude-limiting layer defining the first through hole is provided with a protruding arm protruding toward the center of the second through hole, and an orthographic projection of the protruding arm extends to the opening region of the cavity.

12. The MEMS device according to claim 11, wherein the second amplitude-limiting layer is provided with a plurality of protruding arms, adjacent protruding arms are at equal spacing, and orthographic projections of the protruding arms extend to an equal length within the opening region of the cavity.

13. The MEMS device according to claim 9, wherein the diameter of the second through hole provided on the second isolation layer is greater than or equal to an opening width of the cavity, and the second isolation layer is entirely supported on the second sacrificial layer.

14. A Micro-Electro-Mechanical System (MEMS) device, comprising:
- a substrate;
- a first sacrificial layer disposed on the substrate, the substrate being provided with a back cavity penetrating the substrate and the first sacrificial layer;
- a first conductive film disposed on the first sacrificial layer and covering the back cavity;
- a second sacrificial layer disposed on the first conductive film, the second sacrificial layer being provided with a cavity penetrating the second sacrificial layer;
- a second conductive film disposed on the second sacrificial layer and covering the cavity;
- a first amplitude-limiting layer and a first isolation layer that are laminated, wherein the first amplitude-limiting layer is provided with a first through hole, the first isolation layer is provided with a second through hole, and an orthographic projection of the first through hole is located in the second through hole and a diameter of the first through hole is smaller than that of the second through hole; an orthographic projection of the first amplitude-limiting layer partially overlaps with an opening region of the cavity, and the orthographic projection of the first through hole also partially overlaps with the opening region of the cavity; the first amplitude-limiting layer is located between the first conductive film and the first sacrificial layer, and the first isolation layer is located between the first amplitude-limiting layer and the first conductive film; and
- a second amplitude-limiting layer and a second isolation layer that are laminated, wherein the second amplitude-limiting layer is provided with a first through hole, the second isolation layer is provided with a second through hole, and an orthographic projection of the first through hole is located in the second through hole and a diameter of the first through hole is smaller than that of the second through hole; an orthographic projection of the second amplitude-limiting layer partially overlaps with an opening region of the cavity, and the orthographic projection of the first through hole also partially overlaps with the opening region of the cavity; the second amplitude-limiting layer is located on the second conductive film, and the second isolation layer is located between the second amplitude-limiting layer and the second conductive film.

15. The MEMS device according to claim 14, wherein the diameter of the second through hole provided on the first isolation layer is less than or equal to an opening width of the cavity, the second sacrificial layer is entirely supported on the first isolation layer, the diameter of the second through hole provided on the second isolation layer is greater than or equal to the opening width of the cavity, and the second isolation layer is entirely supported on the second sacrificial layer.

* * * * *